United States Patent [19]

Muchnick et al.

[11] Patent Number: 5,636,347
[45] Date of Patent: Jun. 3, 1997

[54] COMPUTER CARD INSERTION DETECTION CIRCUIT

[75] Inventors: Michael J. Muchnick, Fair Oaks; Jerry A. Verseput; Jasmin Ajanovic, both of Folsom, all of Calif.

[73] Assignee: Intel Corporation, Santa Clara, Calif.

[21] Appl. No.: 733,335

[22] Filed: Oct. 17, 1996

Related U.S. Application Data

[63] Continuation of Ser. No. 313,454, Sep. 27, 1994, abandoned.

[51] Int. Cl.⁶ .................................................. G06F 13/20
[52] U.S. Cl. ........................................ 395/283; 395/282
[58] Field of Search ...................................... 395/282, 283

[56] References Cited

U.S. PATENT DOCUMENTS

| | | | |
|---|---|---|---|
| 4,245,270 | 1/1981 | Busby | 361/58 |
| 5,210,855 | 5/1993 | Bartol | 395/500 |
| 5,268,592 | 12/1993 | Bellamy et al. | 307/43 |
| 5,317,697 | 5/1994 | Husak et al. | 395/500 |
| 5,410,717 | 4/1995 | Floro | 395/800 |

*Primary Examiner*—Gopal C. Ray
*Assistant Examiner*—Jeffrey K. Seto
*Attorney, Agent, or Firm*—Blakely, Sokoloff, Taylor & Zafman

[57] ABSTRACT

A personal computer (PC) card insertion method and apparatus uses a subset of connector ground terminals and pins, located at either end of the connector, for detecting the onset of a card insertion. The host PC card slot connector has pull-up resistors for keeping the subset of ground terminals at a high logic level ($V_{CC}$). Also, the subset of pins are made longer than the signal pins so that when an insertion of a PC card begins, the grounding of one or more of the subset of pins indicates that a PC card insertion has begun, allowing the host system to take the necessary precautions to ensure an orderly acceptance of the card without any undesirable system affects that might otherwise result. Also, a logic network for using the subset of connector terminals as additional grounding connections is provided upon completion of the insertion.

15 Claims, 7 Drawing Sheets

FIG. 2A
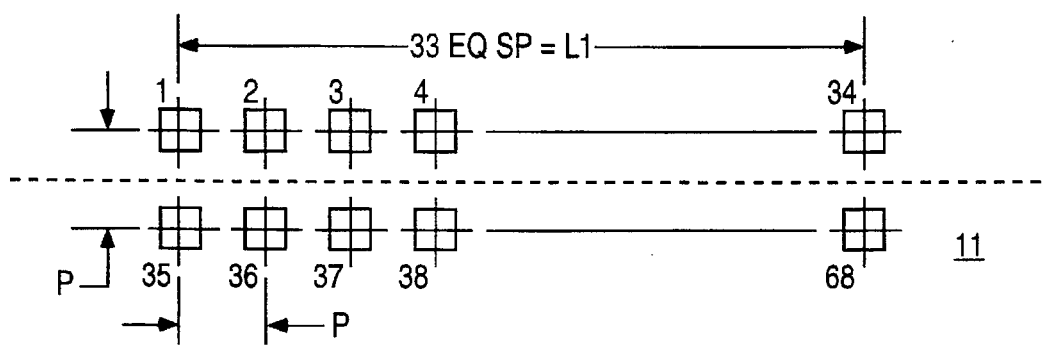
FIG. 2B
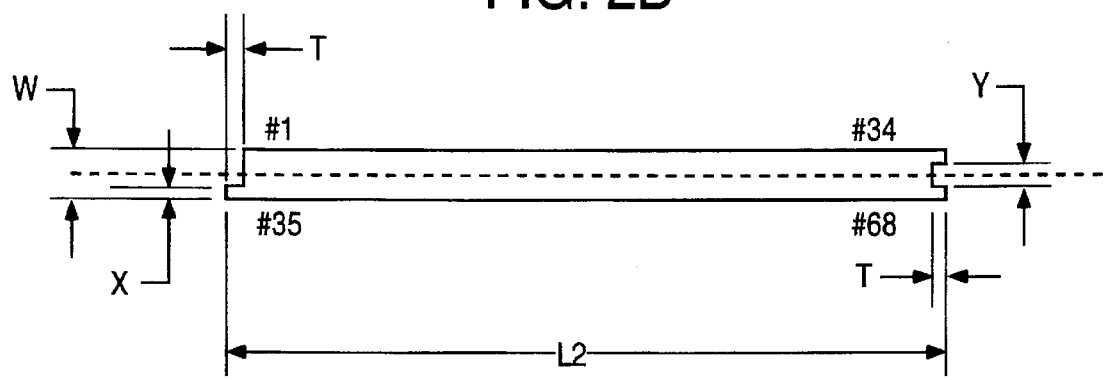
FIG. 2C
| L1 ± .006" | L2 ± .003" | P .004" | T ± .002" | W ± .003" | X ± .002" | Y ± .002" |
|---|---|---|---|---|---|---|
| 1.65" (41.9) | 2.135" (54.23) | .050" (1.27) | .035" (0.90) | .139" (3.53) | .047" (1.20) | .055" (1.40) |

FIG. 3A
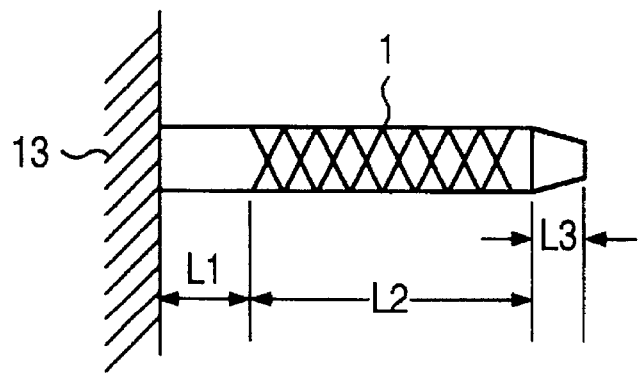
FIG. 3B
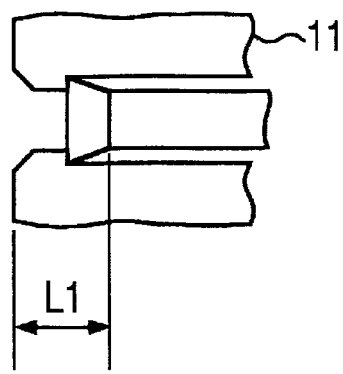
FIG. 3C
| L1 MAX | L2 | | L3 REF |
|---|---|---|---|
| .020" (0.5) | PIN TYPE - SEE TABLE 3-2 | | .024" (0.6) |
| | DETECT | .059 (1.5) ± .039 | |
| | GENERAL | .084 (2.1) ± .064 | |
| | POWER | .098 (2.5) ± .078 | |

5,636,347

COMPUTER CARD INSERTION DETECTION CIRCUIT

This is a continuation of application Ser. No. 08/313,454, filed Sep. 24, 1994, now abandoned.

FIELD OF THE INVENTION

The invention pertains to a method and apparatus for inserting a computer add-in card in an operating computer system, sharing a common bus, without adversely affecting the operation of other cards connected to the common bus.

BACKGROUND OF THE INVENTION

Current practice for ensuring a safe environment for the insertion of a personal computer (PC) card in systems that share common interface signals is by use of mechanical means, such as a push-button switch, to provide an advanced warning of the PC card insertion. The advanced notice halts operations in the host system in an orderly fashion so as to preserve data and operating instruction integrity and to ensure an electrically safe environment for the PC card insertion. This method is unreliable because it depends on a system user to activate the mechanical means before inserting the card.

Another existing method requires connecting a pull-up resistor to one of the backplane socket connector's ground pins which mates with ground pins on the PC card but is not connected to the host system ground plane. If the power and ground pins of a socket are longer than the signal pins, contact of such a pin with socket pin having a pull-up resistor connected to it will cause that socket pin to be high and then go low at the onset of an insertion before any of the signal pins make contact. This provides an advanced indication that a PC card is being inserted. The advanced indication may be used by the host system to indicate any action that might be required for maintaining an orderly system.

The drawback to this second method is that a pin normally used for a ground pin is assigned to insertion detection and thus cannot be used for a normal ground connection between the system and the PC card, resulting in reduced reliability of the PC card interface.

A further disadvantage of this second method is that only one pin is used for detecting the onset of a card insertion. As a result, if the PC card were to be inserted at an angle offset from normal to the socket, contacts at one end of the PC card may make contact before the onset of a PC card insertion can be detected.

SUMMARY AND OBJECTS OF THE INVENTION

A circuit card pin configuration is described that provides for automatic detection of the onset of a circuit card insertion into a host backplane connector that eliminates the aforementioned problems associated with the prior art.

An object of the invention is to provide a pair of circuit and pins located at opposite ends of the circuit card connector for detecting the onset of an insertion, thereby compensating for any skewing of the card when inserting into the socket.

Another object is to provide a logic network for sensing of either or both connector ends in the process of insertion and providing an electrical indicator of the onset of insertion to the host system.

Another object is to improve interface reliability by using the same circuit card ground pins for system ground plane connections as those used in detection of the onset of card insertions.

BRIEF DESCRIPTION OF THE DRAWINGS

The present invention may be understood more fully from the detailed description given below and from the accompanying drawings of the preferred embodiments of the invention which, however, should not be taken to limit the invention to the specific embodiment but are for explanation and understanding only.

FIG. 2A, FIG. 2B, and FIG. 2C shows an end view of the personal computer (PC) card with pin arrangement.

FIG. 3A, FIG. 3B, and FIG. 3C shows a plane view of the personal computer (PC) box connecting pin arrangement.

DETAILED DESCRIPTION OF THE INVENTION

In the following description of the present invention, reference is made to a popular standard printed circuit board connector for the purpose of explaining the invention. However, it will be recognized by those practicing the art that the principles expounded in this description of the invention are not limited to this specific connector and circuit board configuration.

Figure 1:
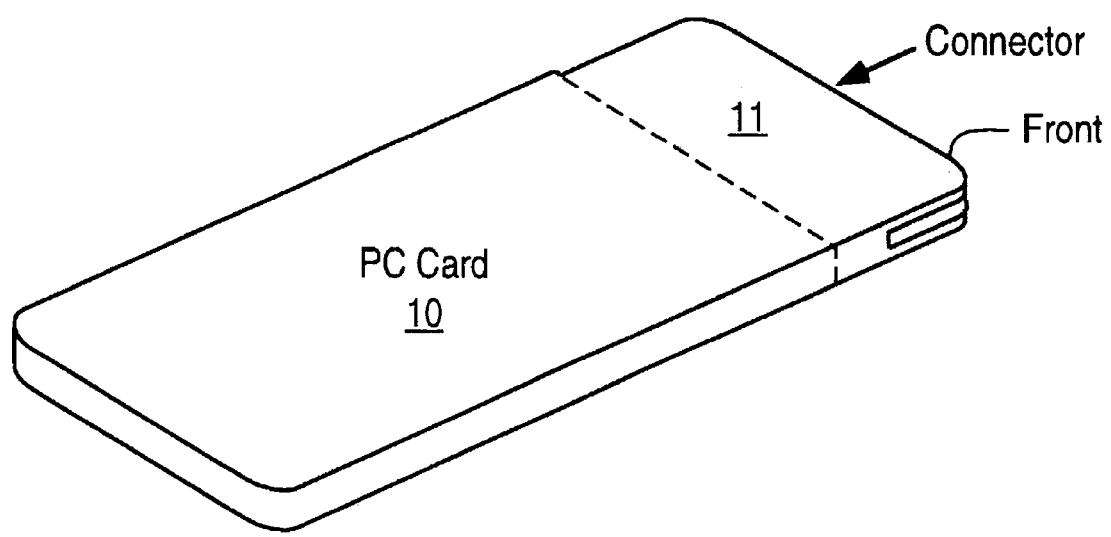
FIG. 1 is a isometric drawing of a typical personal computer (PC) card.

FIG. 1 is an isometric drawing of a personal computer (PC) card 10 conforming to the to the Personal Computer Memory Card International Association (PCMCIA) standard. The card is used to hold electronic circuitry, including memory arrays, and is intended to plug into a frame wherein the PC card makes electrical connections through its socket connector 11 with a mating connector of the host system.

FIG. 2A, FIG. 2B, and FIG. 2C show a frontal view of PC card 10 and the socket layout dimensions. FIG. 2(a) shows the PC card connector sockets, numbered 1 through 34 on the top row and 35 through 68 on the bottom row. FIG. 2(b) shows the physical outline (without sockets) as seen from the front. The PC card female socket connector mates with the male pin connector 13 in the host frame as shown in detail for a single pin in FIG. 3A, FIG. 3B, and FIG. 3C.

Figure 4:
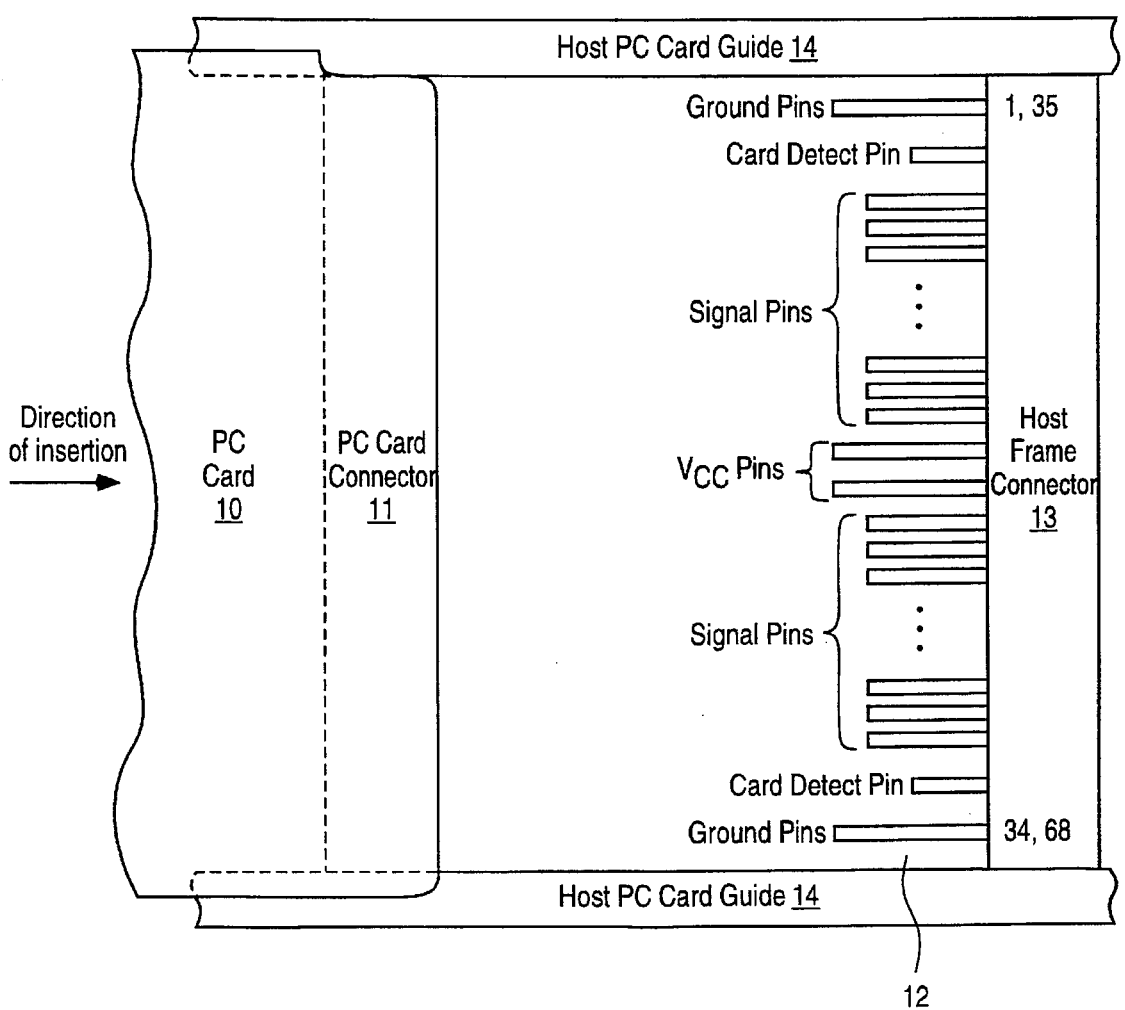
FIG. 4 shows a typical PC receptacle pin and card connection socket.

An important feature of the host frame connector pins 12 is shown in FIG. 4. Pins 1, 34, 35, and 68 are dedicated as ground pins and noticeably longer than the signal pins. A group of pins at the center of the connector are of the same length as the ground pins and are dedicated as $V_{CC}$ pins for providing power to the card using the ground pins for the return current path. A third set of pins adjacent to ground pins 1, 35 and 34, 68 are noticeably shorter than the signal pins, designated as card detect pins, are used to allow for an electrical indication to the host system that a PC card has been inserted in a specific socket location of the host frame. Thus, upon insertion of a PC card, this configuration, that uses three distinct pin lengths, provides for ground pins 1, 34, 35, and 38 to mate with corresponding ground and $V_{CC}$ contacts of the PC card first, followed by the connection of the signal pins, and lastly establishing contact with the card detect pins.

Figure 5:
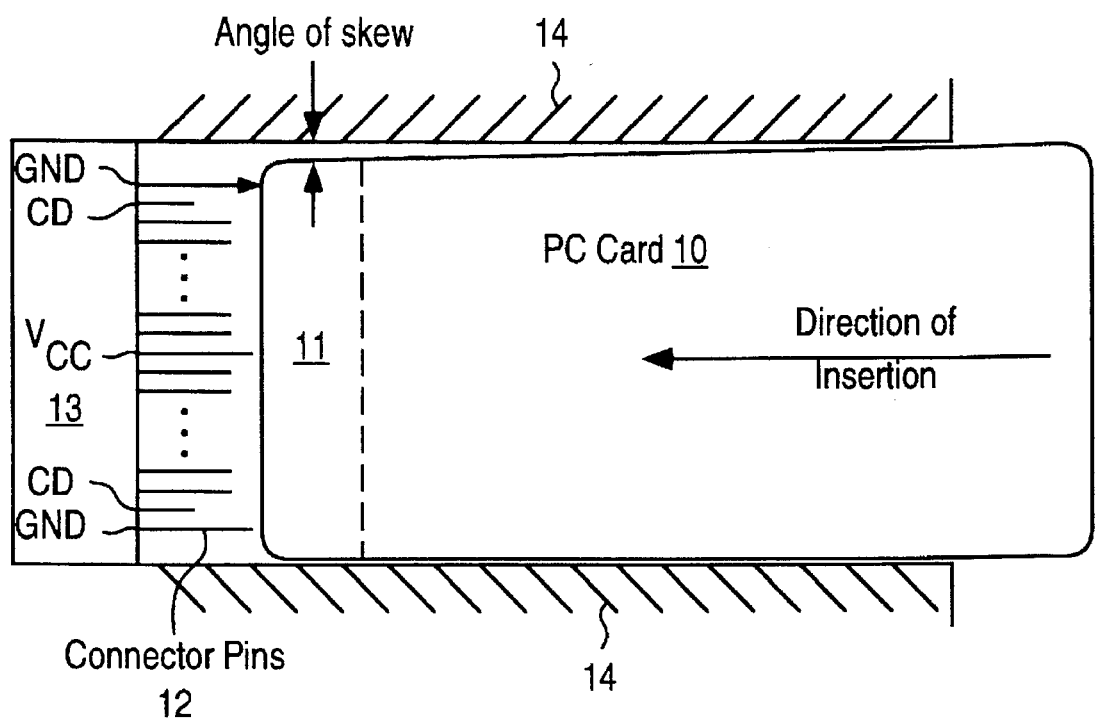
FIG. 5 shows a skewed PC card insertion.

This orderly sequence of connections may not be realized in practice because of the necessary mechanical tolerances in the fit between PC card 10 and the guide rails 14 of the host frame. FIG. 5 shows how the insertion of PC card 10 may result in a skewed relationship between the guide rails 14 and PC card 10. Consequently, it is possible for only some of the ground pins to make contact before $V_{CC}$ is applied or signal pins make contact with connector 11 of PC card 10. However, if the host system is prepared to receive the PC card by having shut-down power ($V_{CC}$) to the host connector 13, the skewed card may be seated without any adverse effects. When finally seated, power may be restored to the $V_{CC}$ pin.

Figure 6:
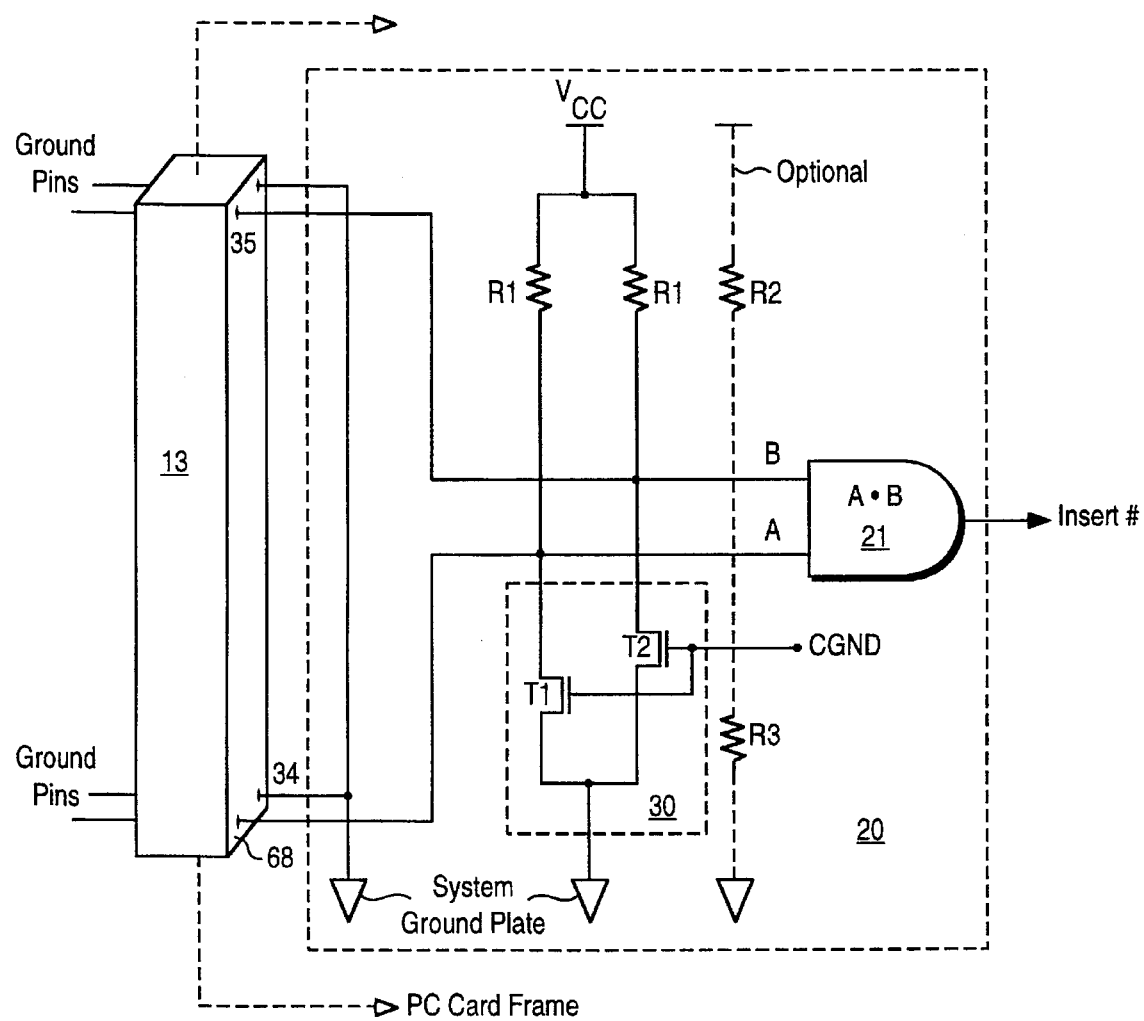
FIG. 6 shows a schematic of a card insertion detection circuit.

In order to provide for an electrical indication to the host system that a PC card is about to be seated in the host frame, the PC card insertion detection system shown in FIG. 6 may be used.

The host frame pin connector 13 is shown together with ground pins 1, 34, 35, and 68 (all other pins are not shown for better clarity). One pin on each end of connector 13 is shown connected to the host system ground plane. In the example of FIG. 6, pins 1 and 34 are shown connected to system ground while "ground pins" 35 and 68 are connected to PC card insertion detection system 20. It is only required that any one ground pin at each end of connector 13 be connected to the host system ground.

Detection system 20 comprises two-input AND-gate 21 with input B connected to "ground pin" 35 and input A connected to "ground pin" 68. Pull-up resistors R1 are used to hold inputs A and B high when FET transistors T1 and T2 are nonconducting. Under these circumstances, the card slot corresponding to pin connector 13 is vacant, causing AND-gate 21 to produce an output signal (INSERT#) in a high state indicating the absence of a PC card in its associated card slot.

Upon insertion of a PC card as shown in FIG. 5, initial contact between PC card connector 11 and pins 12 of host slot connector 13 will generally be made by the ground pin (1 or 34) at either end of the connector and its companion pin (35 or 68, respectively). Because the corresponding sockets in PC card connector 11 are connected to a common PC card ground plane, this will cause AND-gate inputs A or B to be pulled low and result in AND-gate output signal INSERT# to also go low, giving the host system processor an early warning that PC card insertion has commenced.

This early warning causes the host processor to halt operations in an orderly fashion so that any transients associated with the insertion of a PC card do not affect the data or system operation. Typically, amongst other possible actions, the host lowers the supply voltage, $V_{CC}$, to zero, allowing the PC card to complete the insertion process without power being applied to the $V_{CC}$ pin of pin connector 13. Upon completion of the card insertion, $V_{CC}$ to the PC card is restored and the inserted PC card is made functional. Output signal INSERT# remains low.

With this limited form of insertion detection circuit, and with the optional use of the information provided to the host by the card detection pins on host frame connector 13 indicating that a card has been inserted into the card slot, the host processor would know that a PC card is resident in that particular slot. Thus, the card insertion detection system satisfies a basic objective of the invention: providing a skew independent PC card insertion advanced warning signal to the host system.

A disadvantage of the limited detection system described above is that two of the four ground pins (pins 35 and 68, in this example) are not used to establish a direct ground connection to the host system ground plane thereby reducing the effective current carrying capacity of the connection.

In order to remove this limitation, ground restoration circuit 30 may be added. FET power transistors T1 and T2 have their drains connected to AND-gate inputs A and B respectively, and their sources connected to the host system ground plane. The gates of T1 and T2 are both connected to control terminal CGND. If control CGND is made logically high, transistors T1 and T2 are turned-on, causing pins 35 and 68 to be grounded to the host ground plane through the low resistance drain to source paths of T2 and T1, respectively. In this manner, the host system can restore the grounding function of pins 35 and 68.

Control signal CGND may be provided by the host processor after insertion has been completed by: (1) waiting for a suitable interval of time, (2) detecting the completion of insertion using the PC card detect pins on connector 13, or (3) any other means for indicating the presence of a PC card in a given card frame slot.

A further option for restoring the pin ground connections through transistor T1 and T2 is by providing a connection between the host $V_{CC}$ supply and the CGND terminal of circuit 30 when $V_{CC}$ is restored to the PC slot connector after insertion. This option, shown in FIG. 6 by resistors R2 and R3 connected between host system $V_{CC}$ and ground, requires that the host system $V_{CC}$ supply be turned-off to the socket when a PC card is not present.

Figure 7:
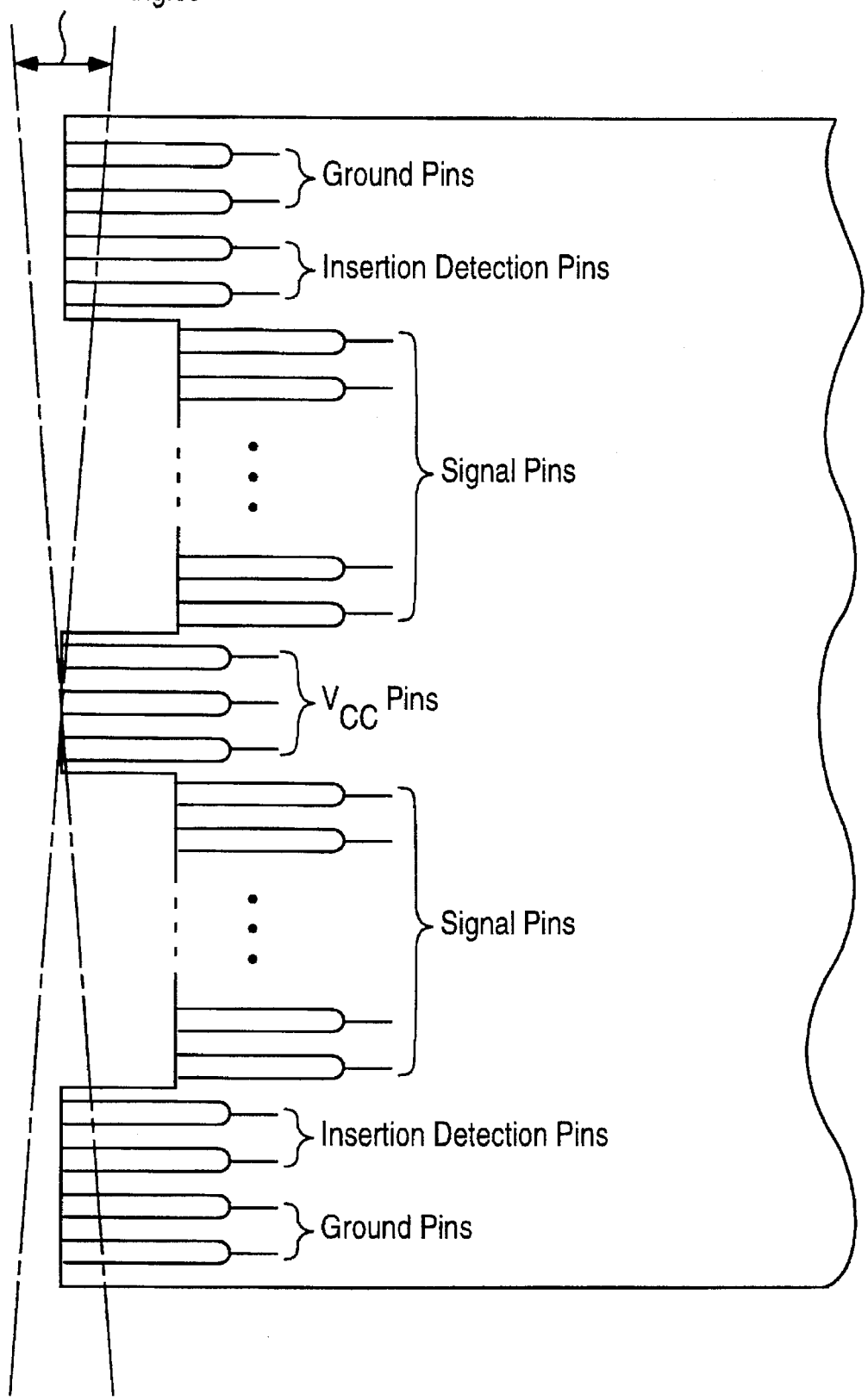
FIG. 7 shows a printed circuit board pin configuration.

It should be noted that the inventive principles described above may be implemented using other components that are well-known in the art. One of these variants includes interchanging pin and socket connectors so that the PC card contains the male pin connector while the host frame connector contains the female socket connector. Another variant could involve the use of a printed board pin connector comprising a single row of plated or deposited pins with the two or more outer pins on either side of the connector acting as ground connectors while the two adjacent or closely placed pins perform the insertion detection function. FIG. 7 is an example of a printed circuit board with connector pins arranged in accordance with the principles described above. Also, other equivalent logic circuits such as implied by DeMorgan's theorem may result in different but equivalent functional circuits.

What is claimed is:

1. A card insertion detection apparatus for providing a warning signal to a host system that a circuit card is in the process of being inserted into a card slot of the host system in order to allow the host system to accept the circuit card in an orderly manner that does not adversely affect the host system by protecting the host system from transients that could result from the connection of the circuit card, the circuit card having a connector with a multiplicity of terminals distributed along the connector's width, and arranged in at least one row, for connecting to corresponding terminals of a mating connector in a host system card slot, the circuit card connector having a group of preassigned ground terminals located near both edges of the connector width, a subset of the group of ground terminals located near both edges being card insertion detection terminals to be used for card insertion detection, the apparatus comprising:

(a) a card slot connector with connector terminals for mating the card slot connector terminals with a circuit card connector terminals;

(b) detection circuitry connected to a subset of the card slot connector terminals corresponding to the card insertion detection terminals of the card slot connector for generating the warning signal indicating the onset of a circuit card insertion by sensing the grounding of at least one terminal of the card slot connector terminals; and (c) grounding circuitry that grounds at least one card insertion detection terminal after the circuit card insertion is detected.

2. The apparatus of claim 1 wherein the detection circuitry comprises:
   (a) a multiplicity of pull up resistors, one pull up resistor connected to each card insertion detection terminal of the card slot connector; and
   (b) a multi input AND gate with each AND gate input connected to one terminal of the card slot connector subset of card insertion detection terminals, the AND gate having a binary output with a first state indicating that all input signals are high, and a second state indicating that at least one input is low, the low state signifying the onset of the circuit card insertion.

3. The apparatus of claim 1 wherein the grounding circuitry comprises solid state switches.

4. The apparatus of claim 3 wherein the solid state switches are gate controlled field effect transistors.

5. The apparatus of claim 1 wherein the grounding circuit is controlled by the $V_{CC}$ voltage supplied to the card slot connector.

6. The apparatus of claim 1 wherein the circuit card connector conforms to a PCMCIA standard and one of the ground terminals from each edge of the connector width are used as card insertion detection terminals.

7. The apparatus of claim 1 wherein the circuit card connector has multiple length pins wherein the subset of the group of ground terminals comprise pins that are longer than data pins.

8. A method for detecting an onset of a card insertion into a card slot connector of a host system in order to allow the host system to accept a circuit card in an orderly manner that does not adversely affect the host system by protecting the host system from transients that could result from the card insertion, the circuit card having a connector with a multiplicity of terminals distributed along the connector's width and arranged in at least one row for connecting to corresponding terminals of a mating connector in a card slot of the host system, the circuit card connector having a group of preassigned terminals located near both edges of the connector width that includes a set of ground terminals, a subset of the ground terminals to be used for card insertion detection, the method comprising:
   (a) establishing initial contact between the circuit card connector and the mating connector in the card slot of the host system;
   (b) sensing a ground contact through a mating card insertion detection terminal of the card slot connector;
   (c) generating a signal to the host system indicating the onset of a card insertion; and
   (d) connecting the subset of card insertion detection terminals of a mating card slot connector to ground using augmented conducting paths in order to provide a more effective ground connection between the inserted card and the host system ground.

9. A system for detecting an insertion of a circuit card into a host system and for providing the host system with a warning signal that the circuit card is in the process of being inserted into the host system to allow the host system to accept the circuit card in an orderly manner that does not adversely affect the host system by protecting the host system from transients that could result from connection of the circuit card,
   the circuit card comprising:
      a connector having a multiplicity of terminals distributed along the width of a circuit card connector, and arranged in at least one row, for connecting to the corresponding terminals of a mating connector in a host system card slot; and
      a group of preassigned ground terminals located near both edges of the connector width, a subset of the group of ground terminals located near both edges being card insertion detection terminals to be used for card insertion detection;
   the host system comprising:
      a card slot for the insertion of the circuit card, the card slot having the mating connector containing terminals to mate with the circuit card;
      detection circuitry connected to a subset of the card slot connector terminals corresponding to the card insertion detection terminals of the card slot connector for generating the warning signal indicating the onset of a circuit card insertion by sensing the grounding of at least one terminal of the card slot connector terminals; and
      grounding circuitry that grounds at least one card insertion detection terminal after the circuit card insertion is detected.

10. A means for providing a warning signal to a host system upon detection of a circuit card being inserted into a card slot of the host system in order to allow the host system to accept the circuit card in an orderly manner that does not adversely affect the host system by protecting the host system from transients that could result from the connection of the circuit card, the circuit card having a connector with a multiplicity of terminals distributed along the connector's width, and arranged in at least one row, for connecting to corresponding terminals of a mating connector in a host system card slot, the circuit card connector having a group of preassigned ground terminals located near both edges of the connector width, a subset of the group of ground terminals located near both edges being card insertion detection terminals to be used for card insertion detection, the means for detection comprising:
   (a) a means for mating the host system card slot connector terminals with the circuit card connector terminals;
   (b) detection means connected to a subset of the card slot connector terminals corresponding to the card insertion detection terminals of the card slot connector for generating the warning signal indicating the onset of a circuit card insertion by sensing the grounding of at least one terminal of the card slot connector terminals; and
   (c) grounding means that grounds at least one card insertion detection terminal after the circuit card insertion is detected.

11. The apparatus of claim 1 wherein the grounding circuitry connects at least one of the card insertion detection terminals to ground after waiting a predetermined period of time.

12. The apparatus of claim 1 wherein the grounding circuitry connects at least one of the card insertion detection terminals to ground upon the host system detecting the completion of the circuit card insertion.

13. A card insertion detection apparatus for providing a warning signal to a host system that a circuit card is in the process of being inserted into a card slot of the host system in order to allow the host system to accept the circuit card in an orderly manner that does not adversely affect the host system by protecting the host system from transients that could result from the connection of the circuit card, the circuit card having a connector with a multiplicity of terminals distributed along the connector's width, and arranged in at least one row, for connecting to corresponding terminals of a mating connector in a host system card slot, the circuit card connector having a group of preassigned ground terminals located near both edges of the connector width and a group of preassigned insertion detection terminals located near both edges to be used for card insertion detection, the apparatus comprising:

(a) a card slot connector with connector terminals for mating the card slot connector terminals with a circuit card connector terminals;

(b) detection circuitry connected to the card insertion detection terminals of the card slot connector for generating the warning signal indicating the onset of a circuit card insertion by sensing the grounding of at least one terminal of the card slot connector terminals; and (c) grounding circuitry that grounds at least one card insertion detection terminal after the circuit card insertion is detected.

14. The apparatus of claim 1 wherein the ground which the grounding circuitry connects the card insertion detection terminal is a host system ground plane.

15. The apparatus of claim 1 wherein the grounding circuitry disconnects the path between the card insertion detection terminals and ground during circuit card insertion.

* * * * *